(12) United States Patent
Lan et al.

(10) Patent No.: US 12,490,617 B2
(45) Date of Patent: Dec. 2, 2025

(54) PIXEL ARRANGEMENT STRUCTURE AND DISPLAY PANEL

(71) Applicant: Hefei Visionox Technology Co., Ltd., Anhui (CN)

(72) Inventors: Lan Lan, Anhui (CN); Shaoya Qiu, Anhui (CN); Yi Qu, Anhui (CN); Menghua Kang, Anhui (CN); Qingqing Dong, Anhui (CN); Dandan Feng, Anhui (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 488 days.

(21) Appl. No.: 18/192,928

(22) Filed: Mar. 30, 2023

(65) Prior Publication Data

US 2023/0247886 A1  Aug. 3, 2023

Related U.S. Application Data

(63) Continuation of application No. PCT/CN2021/117242, filed on Sep. 8, 2021.

(30) Foreign Application Priority Data

Dec. 10, 2020  (CN) .......................... 202011435804.6

(51) Int. Cl.
*H10K 59/35* (2023.01)
*H10K 50/86* (2023.01)
(Continued)

(52) U.S. Cl.
CPC ......... *H10K 59/353* (2023.02); *H10K 59/351* (2023.02)

(58) Field of Classification Search
CPC .. H10K 59/353; H10K 59/351; H10K 59/352; H10K 59/122; H10K 50/86; H10K 71/166
See application file for complete search history.

(56) References Cited

U.S. PATENT DOCUMENTS 6,714,206 B1  3/2004  Martin et al.
10,263,047 B2  4/2019  Sato
(Continued)

FOREIGN PATENT DOCUMENTS

CN  103576366 A  2/2014
CN  106960863 A  7/2017
(Continued)

OTHER PUBLICATIONS

International Search Report mailed Nov. 25, 2021, in International Application No. PCT/CN2021/117242, 6 pages (partial English translation provided).
(Continued)

*Primary Examiner* — Mohsen Ahmadi
(74) *Attorney, Agent, or Firm* — Maier & Maier, PLLC

(57) ABSTRACT

A pixel arrangement structure and a display panel. The pixel arrangement structure includes a plurality of repeat units, each of the repeat units is a quadrilateral and includes four pixel groups, each of the pixel groups is located within an area enclosed by two diagonals of the repeat unit, the pixel group includes: a first light-emitting pixel group including at least one first sub-pixel and at least one second sub-pixel arranged along one of the diagonals; a second light-emitting pixel group including at least one first sub-pixel and at least one third sub-pixel arranged along the other of the diagonals; and a backup pixel group located adjacent to an edge of the repeat unit and between the first light-emitting pixel group and the second light-emitting pixel group.

17 Claims, 8 Drawing Sheets

(51) Int. Cl.
*H10K 59/122* (2023.01)
*H10K 71/16* (2023.01)

(56) References Cited

U.S. PATENT DOCUMENTS

| | | | | |
|---|---|---|---|---|
| 2011/0012820 A1* | 1/2011 | Kim | ................. | G09G 3/3208 345/82 |
| 2011/0260951 A1* | 10/2011 | Hwang | ............. | G02F 1/134336 345/55 |
| 2012/0092238 A1* | 4/2012 | Hwang | ................ | G09G 3/3225 345/55 |
| 2016/0300520 A1 | 10/2016 | Wang | | |
| 2016/0351116 A1* | 12/2016 | Sun | ................. | G02F 1/134309 |
| 2016/0380037 A1* | 12/2016 | Kajiyama | ............. | H10K 59/353 257/88 |
| 2019/0140030 A1* | 5/2019 | Huangfu | ............... | G09G 3/3233 |
| 2020/0075687 A1* | 3/2020 | He | ................. | H10K 59/351 |
| 2020/0168692 A1* | 5/2020 | Liu | ................. | H10K 59/352 |
| 2021/0167110 A1* | 6/2021 | Roh | .................. | H10F 39/8023 |
| 2022/0336543 A1* | 10/2022 | Liu | ................. | H10K 59/8723 |

FOREIGN PATENT DOCUMENTS

| | | | |
|---|---|---|---|
| CN | 108321179 A | | 7/2018 |
| CN | 208570613 U | | 3/2019 |
| CN | 109830514 A | | 5/2019 |
| CN | 109904193 A | | 6/2019 |
| CN | 110176476 A | | 8/2019 |
| CN | 110190089 A | | 8/2019 |
| CN | 110518047 A | | 11/2019 |
| CN | 111354762 A | | 6/2020 |
| CN | 111384096 A | | 7/2020 |
| CN | 111491110 A | | 8/2020 |
| CN | 111725289 A | | 9/2020 |
| CN | 112563312 A | | 3/2021 |
| DE | 102019134189 A1 | | 6/2020 |

OTHER PUBLICATIONS

Office Action issued on Mar. 25, 2025, in corresponding Korean Application No. 10-2023-7018221, 4 pages.

Notification to Grant Patent Right for Invention issued on Apr. 1, 2022, in corresponding Chinese Application No. 202011435804.6, 6 pages.

Office Action issued on Jan. 25, 2022, in corresponding Chinese Application No. 202011435804.6, 12 pages.

* cited by examiner

PIXEL ARRANGEMENT STRUCTURE AND DISPLAY PANEL

CROSS REFERENCE TO RELATED APPLICATION

The present application is a continuation of International Application No. PCT/CN2021/117242, filed on Sep. 8, 2021, which claims the priority to Chinese Patent Application No. 202011435804.6, filed on Dec. 10, 2020, both of which are incorporated herein by reference in their entireties.

TECHNICAL FIELD

The present application relates to the field of display technology, and particularly, to a pixel arrangement structure and a display panel.

BACKGROUND

Organic Light-Emitting Diode (OLED) is an active light-emitting device. Compared with the traditional Liquid Crystal Display (LCD) display, OLED display does not require backlight and is self-luminous. OLED utilizes a thin film of organic material and a glass substrate, and when an electric current flows through, the organic material will emit light. Therefore, OLED display panels can save significant power, be made light and thin, withstand a wider range of temperature change than LCD display panels and have large viewing angles. OLED display panels are expected to become the next generation of panel display technology after LCD and are currently one of the most popular technologies in the field of panel display technology.

SUMMARY

The embodiments of the present application provide a pixel arrangement structure and a display panel, aiming to improve the display effect of the display panel.

Embodiments of a first aspect of the present application provide a pixel arrangement structure comprising a plurality of repeat units arranged in an array, each of the repeat units being a quadrilateral and comprising four pixel groups, each of the pixel groups being located within an area defined by two diagonals of the repeat unit, wherein the pixel group comprises: a first light-emitting pixel group comprising at least one first sub-pixel and at least one second sub-pixel arranged along one of the diagonals; a second light-emitting pixel group comprising at least one first sub-pixel and at least one third sub-pixel arranged along the other of the diagonals, the at least one first sub-pixel in the first light-emitting pixel group and the at least one first sub-pixel in the second light-emitting pixel group being symmetrically distributed about a symmetry line, and the at least one second sub-pixel in the first light-emitting pixel group and the at least one third sub-pixel in the second light-emitting pixel group being symmetrically distributed about the symmetry line; and a backup pixel group located adjacent to an edge of the repeat unit and between the first light-emitting pixel group and the second light-emitting pixel group, the backup pixel group at least comprising a second backup sub-pixel and a third backup sub-pixel, the second backup sub-pixel having the same emitting color as the second sub-pixel and the third backup sub-pixel having the same emitting color as the third sub-pixel.

Embodiments of a second aspect of the present application further provide a display panel comprising the pixel arrangement structure of any one of the embodiments of the first aspect.

According to the pixel arrangement structure of the embodiments of the present application, the pixel arrangement structure includes a plurality of repeat units arranged in an array, and each of the repeat units is a quadrilateral, then the repeat unit has two diagonals. The repeat unit includes four pixel groups, and each of the pixel groups is located within the area enclosed by the two diagonals of the repeat unit. Each of the pixel groups includes the first light-emitting pixel group, the second light-emitting pixel group and the backup pixel group. The first light-emitting pixel group includes the first sub-pixel and the second sub-pixel arranged along one of the diagonals, and the second light-emitting pixel group includes the first sub-pixel and the third sub-pixel arranged along the other of the diagonals, so that the first light-emitting pixel group and the second light-emitting pixel group can be distributed more evenly in the area where the pixel group is located. The backup pixel group is located between the first light-emitting pixel group and the second light-emitting pixel group, and thus is closer to both the first light-emitting pixel group and the second light-emitting pixel group. The backup pixel group includes the second backup sub-pixel having the same emitting color as the second sub-pixel and the third backup sub-pixel having the same emitting color as the third sub-pixel. If the pixel arrangement structure is used in the display panel, when the display panel is illuminated for display, the sub-pixels in the backup pixel group can be used as compensation pixels, and the color gamut of the display panel can be widened by activating the second backup sub-pixel and the third backup sub-pixel, so that the image display is finer. Therefore, the embodiments of the present application can widen the color gamut of the display panel and improve the display effect of the display panel.

DETAILED DESCRIPTION

For a better understanding of the present application, the electrical pixel arrangement structure, the display panel, the electronic device and the mask assembly according to the embodiments of the present application are described in detail below with reference to FIGS. 1 to 11.

Figure 1:
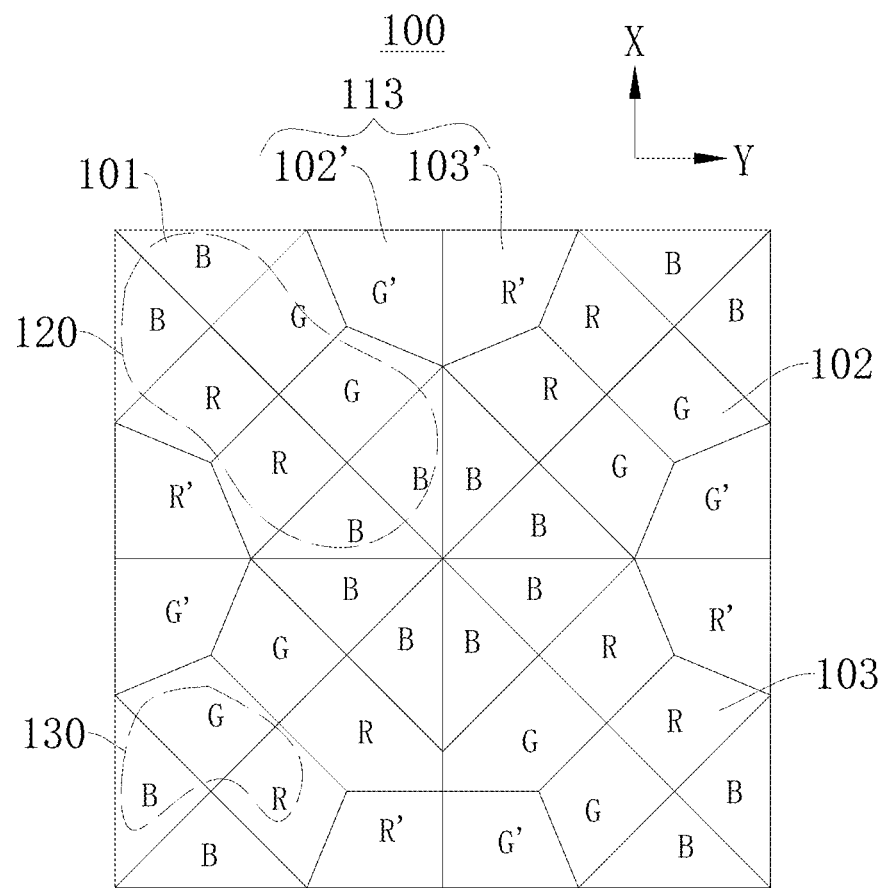
FIG. 1 shows a schematic structural diagram of a repeat unit in a pixel arrangement structure according to an embodiment of the first aspect of the present application.
Figure 2:
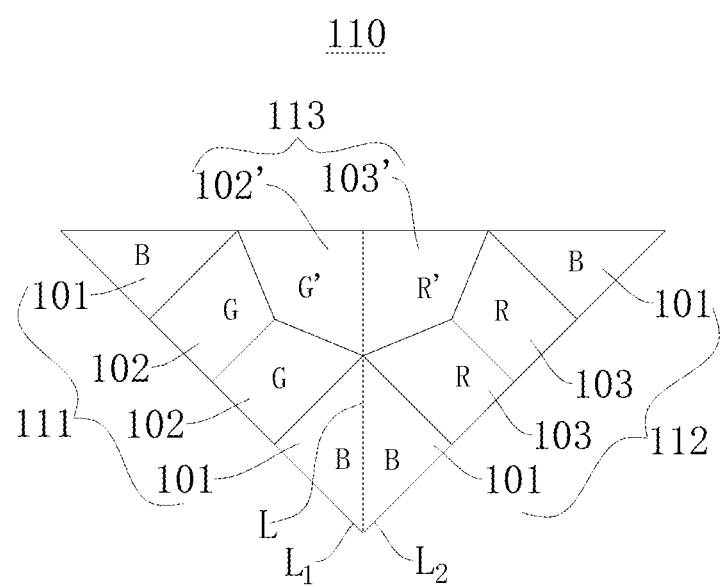
FIG. 2 shows a schematic structural diagram of a pixel group of a repeat unit in a pixel arrangement structure according to an embodiment of the first aspect of the present application.
Figure 3:
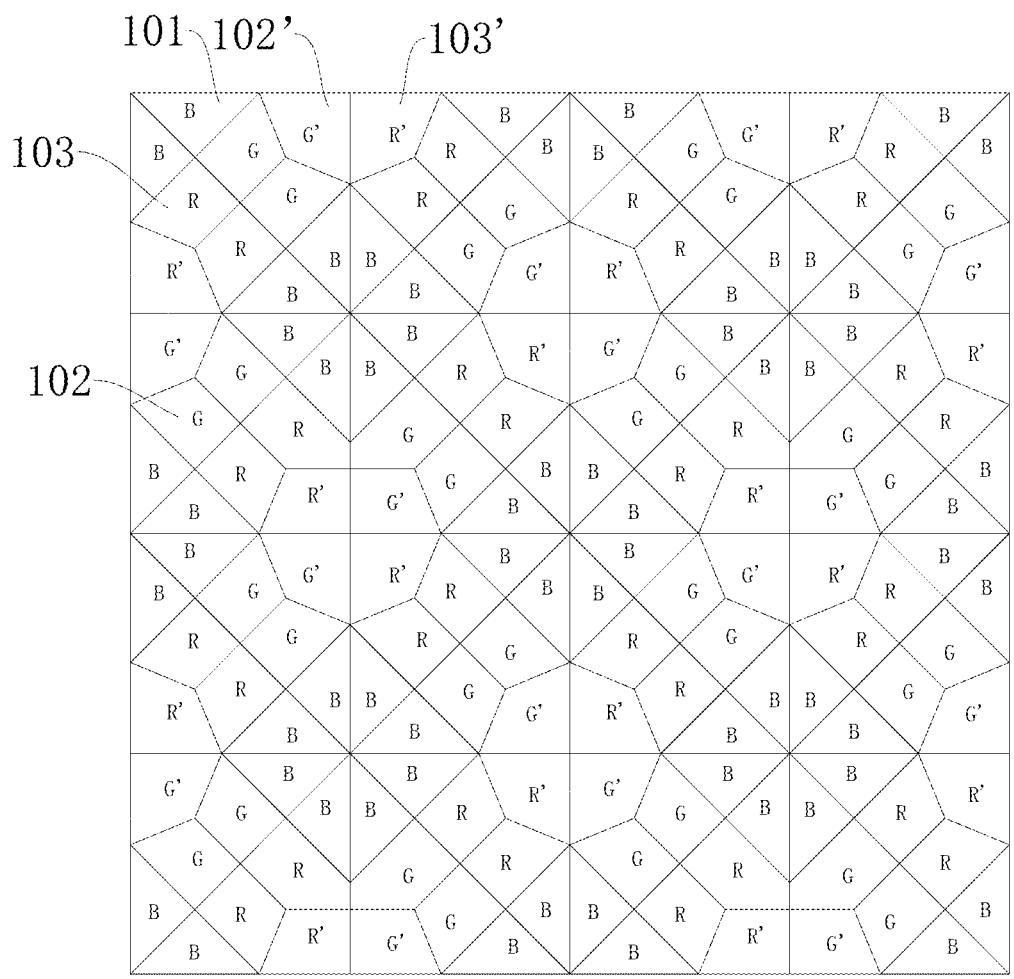
FIG. 3 shows a schematic diagram of a pixel arrangement structure according to an embodiment of the first aspect of the present application.

Referring to FIGS. 1 to 3 together, the pixel arrangement structure includes a plurality of repeat units 100 arranged in an array, and each of the repeat units 100 is a quadrilateral and thus has two diagonals. The repeat unit 100 includes four pixel groups 110, and each of the pixel groups 110 is located within the area enclosed by the two diagonals of the repeat unit 100. That is, each of the pixel groups 110 is located within the area defined by the two diagonals of the repeat unit 100, i.e., each of the pixel groups 110 is located within the area enclosed by the two diagonals and the edges of the repeat unit 100. Each of the pixel groups 110 includes the first light-emitting pixel group 111, the second light-emitting pixel group 112 and the backup pixel group 113. The first light-emitting pixel group 111 includes at least one first sub-pixel 101 and at least one second sub-pixel 102 arranged along one of the diagonals. The second light-emitting pixel group 112 includes at least one first sub-pixel 101 and at least one third sub-pixel 103 arranged along the other of the diagonals. The at least one first sub-pixel 101 in the first light-emitting pixel group 111 and the at least one first sub-pixel 101 in the second light-emitting pixel group 112 are of the same number and symmetrically distributed about a symmetry line L. The at least one second sub-pixel 102 in the first light-emitting pixel group 111 and the at least one third sub-pixel 103 in the second light-emitting pixel group 112 are of the same number and symmetrically distributed about the symmetry line L. The backup pixel group 113 is located adjacent to an edge of the repeat unit 100 and between the first light-emitting pixel group 111 and the second light-emitting pixel group 112. The backup pixel group 113 includes at least the second backup sub-pixel 102' and the third backup sub-pixel 103'. The second backup sub-pixel 102' has the same emitting color as the second sub-pixel 102, and the third backup sub-pixel 103' has the same emitting color as the third sub-pixel 103.

As shown in FIG. 2, for example, one of the diagonals of the repeat unit 100 is a first diagonal $L_1$ and the other of the diagonals is a second diagonal $L_2$, the first light-emitting pixel group 111 includes the first sub-pixel 101 and the second sub-pixel 102 arranged along the first diagonal $L_1$, and the second light-emitting pixel group 112 includes the first sub-pixel 101 and the third sub-pixel 103 arranged along the second diagonal $L_2$.

The first light-emitting pixel group 111 includes the first sub-pixel 101 and the second sub-pixel 102 arranged along the first diagonal $L_1$, and the second light-emitting pixel group 112 includes the first sub-pixel 101 and the third sub-pixel 103 arranged along the second diagonal $L_2$, so that the first light-emitting pixel group 111 and the second light-emitting pixel group 112 can be distributed more evenly in the area where the pixel group 110 is located. Moreover, when the first sub-pixel 101, the second sub-pixel 102 and the third sub-pixel 103 are arranged along the diagonals in the above manner, the formation of obvious striations by the first sub-pixel 101, the second sub-pixel 102 and the third sub-pixel 103 in a first direction can be avoided.

The backup pixel group 113 is located between the first light-emitting pixel group 111 and the second light-emitting pixel group 112, and thus is closer to both the first light-emitting pixel group 111 and the second light-emitting pixel group 112. The backup pixel group 113 includes the second backup sub-pixel 102' having the same emitting color as the second sub-pixel 102 and the third backup sub-pixel 103' having the same emitting color as the third sub-pixel 103. When the pixel arrangement structure is used in the display panel, when the display panel displays an image, the sub-pixels in the backup pixel group 113 can be used as compensation pixels, and the color gamut of the display panel can be widened by activating the second backup sub-pixel 102' and the third backup sub-pixel 103', so that the image display is finer. Therefore, the embodiments of the present application can widen the color gamut of the display panel and improve the display effect of the display panel.

The first sub-pixel 101, the second sub-pixel 102 and the third sub-pixel 103 may be set in a variety of ways, for example, the first sub-pixel 101 is a blue sub-pixel, the second sub-pixel 102 is a red sub-pixel and the third sub-pixel 103 is a green sub-pixel. In other embodiments, the first sub-pixel 101 may be a red or a green sub-pixel, the second sub-pixel 102 may be a blue or green sub-pixel, and the third sub-pixel 103 may be a blue or red sub-pixel, as long as the first sub-pixel 101, the second sub-pixel 102 and the third sub-pixel 103 are of different colors from each other.

Optionally, the first sub-pixel 101 is a blue sub-pixel and arranged in both the first light-emitting pixel group 111 and the second light-emitting pixel group 112. The light-emitting efficiency of a blue sub-pixel is usually lower than that of a green sub-pixel and a red sub-pixel, and the first sub-pixel 101 is a blue sub-pixel, which can increase the area of the blue sub-pixel and improve the overall service life of the blue sub-pixel.

In some optional embodiments, a ratio of the numbers of the first sub-pixels 101 and the second sub-pixels 102 in the first light-emitting pixel group 111 is 1:1, and a ratio of the numbers of the first sub-pixels 101 and the third sub-pixels 103 in the second light-emitting pixel group 112 is 1:1. Then a ratio of the numbers of the first sub-pixels 101, the second sub-pixels 102 and the third sub-pixels 103 in the pixel group 110 is 2:1:1. The number of the first sub-pixels 101 is great, which can increase the distribution area of the first sub-pixels 101 and improve the service life of the first sub-pixels 101. For example, when the first sub-pixels 101 are blue sub-pixels, as described above, the number of the blue sub-pixels can be increased, and the service life of the blue sub-pixels can be improved.

The various sub-pixels in the pixel group 110 may be arranged in a variety of ways, and in some optional embodiments, in the first light-emitting pixel group 111, each of the number of the first sub-pixels 101 and the number of the second sub-pixels 102 is two, the two first sub-pixels 101 are distributed at intervals along the first diagonal $L_1$, and the two second sub-pixels 102 are distributed along the first diagonal $L_1$ and located between the two first sub-pixels 101. In the second light-emitting pixel group 112, each of the number of the first sub-pixels 101 and the number of the third sub-pixels 103 is two, the two first sub-pixels 101 are distributed at intervals along the second diagonal $L_2$, and the two third sub-pixels 103 are distributed along the second diagonal $L_2$ and located between the two first sub-pixels 101.

When the various sub-pixels are arranged in the above manner, at least one of the first sub-pixels 101 in the first light-emitting pixel group 111 is arranged adjacent to one of the first sub-pixels 101 in the second light-emitting pixel group 112, and these adjacent two first sub-pixels 101 are arranged close to the intersection of the first diagonal $L_1$ and the second diagonal $L_2$, so that these adjacent two first sub-pixels 101 can be formed by evaporation molding with a same opening of an evaporation mask plate, and the pressure of manufacture procedure of the metal mask plate is reduced.

In addition, if the two second sub-pixels 102 are distributed along the first diagonal $L_1$ and the two third sub-pixels 103 are distributed along the second diagonal $L_2$, a certain gap can be left between the two second sub-pixels 102 and the two third sub-pixels 103 to make space for the backup pixel group 113.

The repeat units 100 may be rectangular and arranged in an array along a first direction and a second direction. The structure of the pixel arrangement is simple.

The first direction and the second direction may be set in a variety of ways and may intersect at any preset angle. In some optional embodiments, the angle between the first direction and the second direction is 90°, such as the X-axis (the first direction) and the Y-axis (the second direction) as shown in FIG. 1, so the various repeat units 100 may be arranged horizontally and vertically along the horizontal and vertical directions, the structure is simple and the manufacturing is easy. In addition, the repeat units 100 are rectangular, and the array distribution of the repeat units 100 along the X-axis and the Y-axis can further reduce the space between adjacent two repeat units 100 and increase the pixel density of the pixel arrangement structure.

Optionally, the four pixel groups 110 are distributed around the intersection of the two diagonals, and for two adjacent pixel groups 110 in one of the repeat units 100, the first light-emitting pixel group 111 of one of the two adjacent pixel groups 110 and the second light-emitting pixel group 112 of the other of the two adjacent pixel groups 110 are adjacent to each other and located at two sides of one of the diagonals.

If the four pixel groups 110 are distributed around the intersection of the diagonals and the first light-emitting pixel group 111 and the second light-emitting pixel group 112 within different pixel groups 110 are adjacent and located at two sides of a same diagonal, the space among the first sub-pixels 101, the second sub-pixels 102 and the third sub-pixels 103 of the first light-emitting pixel group 111 and the second light-emitting pixel group 112 within different pixel groups 110 can be reduced, and the display effect of the display unit formed by the first sub-pixels 101, the second sub-pixels 102 and the third sub-pixels 103 of the first light-emitting pixel group 111 and the second light-emitting pixel group 112 is improved.

On the other hand, when the four pixel groups 110 are distributed around the intersection of the diagonals, the first sub-pixels 101, which are arranged close to the intersection of the diagonals, in the first light-emitting pixel group 111 and the second light-emitting pixel group 112 are distributed around the intersection, so that the eight of the first sub-pixels 101 in the four pixel groups 110 are distributed around the intersection and arranged adjacent to each other, and the eight of the first sub-pixels 101 can be formed by evaporation molding with a same opening of a mask plate.

In addition, when the repeat units 100 are arranged in an array along the first direction and the second direction, the two first sub-pixels 101 located at a location where two edges of a repeat unit 100 intersect can be arranged adjacent to the first sub-pixels 101 of the other repeat units 100. For example, the two first sub-pixels 101 located at a location where two edges of a repeat unit 100 intersect can be arranged adjacent to the two first sub-pixels 101 located at the same location in the other three repeat units 100, and these eight of the first sub-pixels 101 can also be formed by evaporation molding with a same opening of a mask plate.

Therefore, in the pixel arrangement structure according to the embodiments of the present application, the eight of the first sub-pixels 101 are arranged adjacent to each other and can be formed by evaporation molding with a same opening of a mask plate.

There are a variety of ways for the pixel arrangement structure to display, for example, in some optional embodiments, for the first light-emitting pixel group 111 and the second light-emitting pixel group 112 located at two sides of a same one of the diagonals: four of the first sub-pixels 101, two of the second sub-pixels 102 and two of the third sub-pixels 103 form one low pixel display unit 120, and the first light-emitting pixel group 111 and the second light-emitting pixel group 112 form the low pixel display unit 120; or one of the first sub-pixels 101, one of the second sub-pixels 120 and one of the third sub-pixels 103 form one high pixel display unit 130, two adjacent high pixel display units 130 share the second sub-pixel 102 and the third sub-pixel 103, and the first light-emitting pixel group 111 and the second light-emitting pixel group 112 form four high pixel display units 130.

FIG. 1 illustrates the low pixel display unit 120 and the high pixel display unit 130 with dashed lines, which do not limit the structure of the pixel arrangement structure according to the embodiments of the present application.

The first light-emitting pixel group 111 and the second light-emitting pixel group 112 contain a total of four first sub-pixels 101, two second sub-pixels 102 and two third sub-pixels 103. The four first sub-pixels 101, the two second sub-pixels 102 and the two third sub-pixels 103 may form one low pixel display unit 120, and the first light-emitting pixel group 111 and the second light-emitting pixel group 112 form the low pixel display unit 120, enabling the pixel arrangement structure to achieve a low pixel display. Moreover, in the low pixel display unit 120, none of the first sub-pixels 101, the second sub-pixels 102 and the third sub-pixels 103 is shared, which ensures that the pixel arrangement structure has a good display effect in a low pixel display state.

The four first sub-pixels 101, the two second sub-pixels 102 and the two third sub-pixels 103 in the first light-emitting pixel group 111 and the second light-emitting pixel group 112 may further form four high pixel display units 130, enabling the pixel arrangement structure to achieve a high pixel display. Two adjacent high pixel display units 130 share the second sub-pixel 102 and the third sub-pixel 103, the pixel density is maintained while the number of the second sub-pixels 102 and the third sub-pixels 103 is reduced, the aperture ratio of the pixels is increased and the area of the second sub-pixels 102 and the third sub-pixels 103 is increased, and moreover, the area of the evaporation opening on the mask plate corresponding to the second sub-pixels 102 and third sub-pixels 103 is increased and the structure of the mask plate is simplified.

Therefore, the pixel arrangement structure according to the embodiments of the present application can achieve both the low pixel display, which ensures a good display effect for the low pixel display, and the high pixel display, which does not bring much difficulty to the manufacturing process.

As described above, a certain gap can be left between the two second sub-pixels 102 and the two third sub-pixels 103, in which the backup pixel group 113 is arranged. The backup pixel group 113 may be arranged in the gap in a variety of ways, the second backup sub-pixel 102' in the backup pixel group 113 is arranged adjacent to the second sub-pixels 102, so that the second backup sub-pixel 102' and the two second sub-pixels 102 can be formed by evaporation molding with a shared evaporation opening of a mask plate. Optionally, the third backup sub-pixel 103' is arranged adjacent to the third sub-pixels 103, so that the third backup sub-pixel 103' and the third sub-pixels 103 can be formed by evaporation molding with a shared opening.

The backup pixel group 113 may be arranged in a variety of ways, still referring to FIGS. 1 to 3, the backup pixel group 113 includes one second backup sub-pixel 102' and one third backup sub-pixel 103'.

In the above embodiments, the repeat unit 100 is a square, and thus the shape of the repeat unit 100 is more regular and the distribution area of the various pixel groups 110 within the repeat unit 100 is more even.

When the repeat unit 100 is a square, the eight of the first sub-pixels 101 that are arranged close to the intersection of the two diagonals are distributed as, for example, a square, and the opening on the mask plate for evaporation of the first sub-pixels 101 is a square, the forming process of the mask plate can be simplified.

Further optionally, the two first sub-pixels 101 located at the intersection of two edges of the repeat unit 100 are distributed as an isosceles right triangle. When the repeat units 100 are distributed in an array along the first direction and the second direction, the two first sub-pixels 101 located at the intersection of two edges of each of the four repeat units 100 are arranged adjacent to each other, and these eight of the first sub-pixels 101 may also be distributed as a square.

Optionally, the two first sub-pixels 101 in the first light-emitting pixel group 111 are symmetrically distributed and have the same size. Therefore, the eight of the first sub-pixels 101 located at different locations in the pixel arrangement structure have the same size, and the evaporation openings on the mask plate for evaporation the first sub-pixels 101 have the same size.

In these optional embodiments, the two second sub-pixels 102 and the second backup sub-pixel 102' that are adjacent are distributed as a pentagonal. The two third sub-pixels 103 and the third backup sub-pixel 103' that are adjacent are distributed as a pentagonal.

Optionally, the second backup sub-pixel 102' and the third backup sub-pixel 103' are symmetrically distributed about the symmetry line L, so that the arrangement of the various sub-pixels in the backup pixel group 113 is more regular and the color rendering of the pixel arrangement structure is more uniform.

Figure 4:
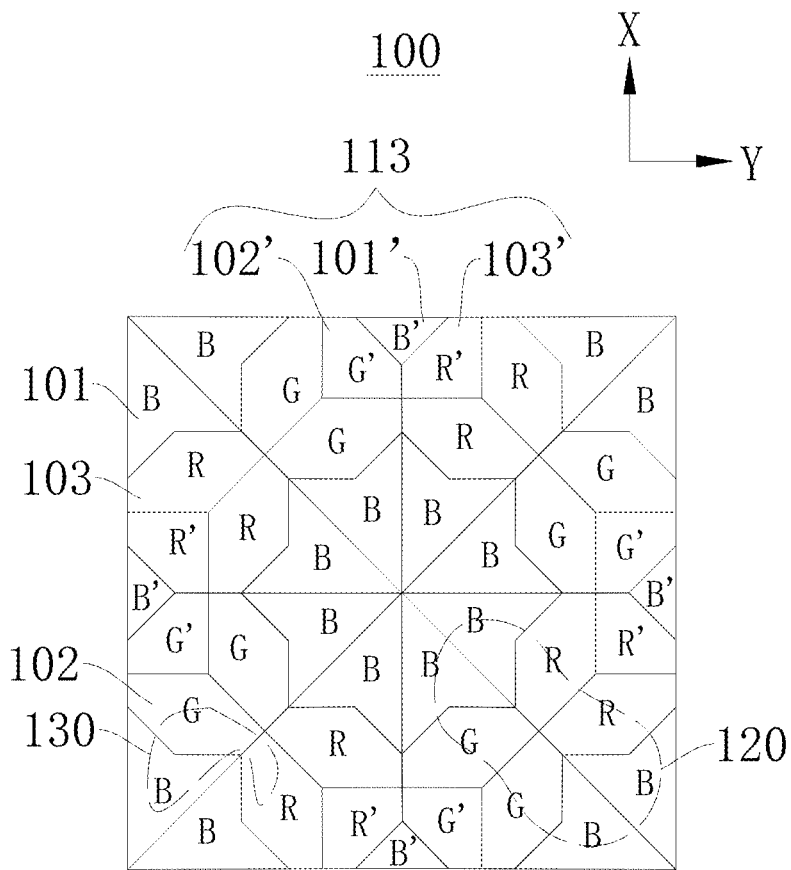
FIG. 4 shows a schematic structural diagram of a repeat unit in a pixel arrangement structure according to another embodiment of the first aspect of the present application.
Figure 5:
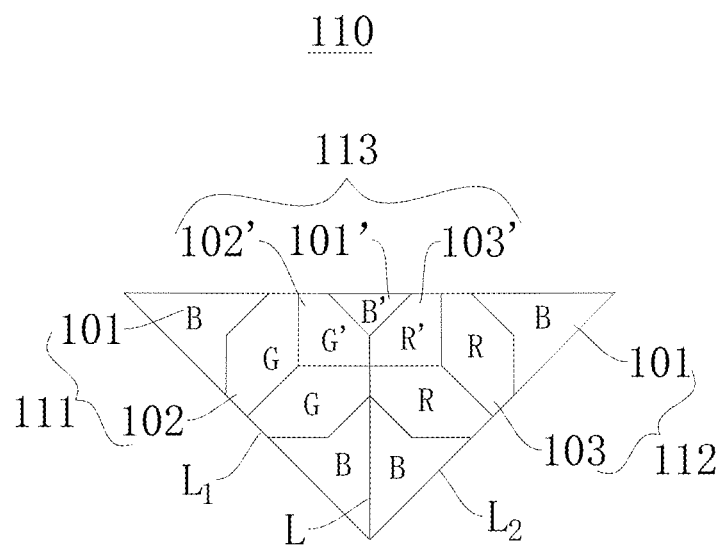
FIG. 5 shows a schematic structural diagram of a pixel group of a repeat unit in a pixel arrangement structure according to another embodiment of the first aspect of the present application.
Figure 6:
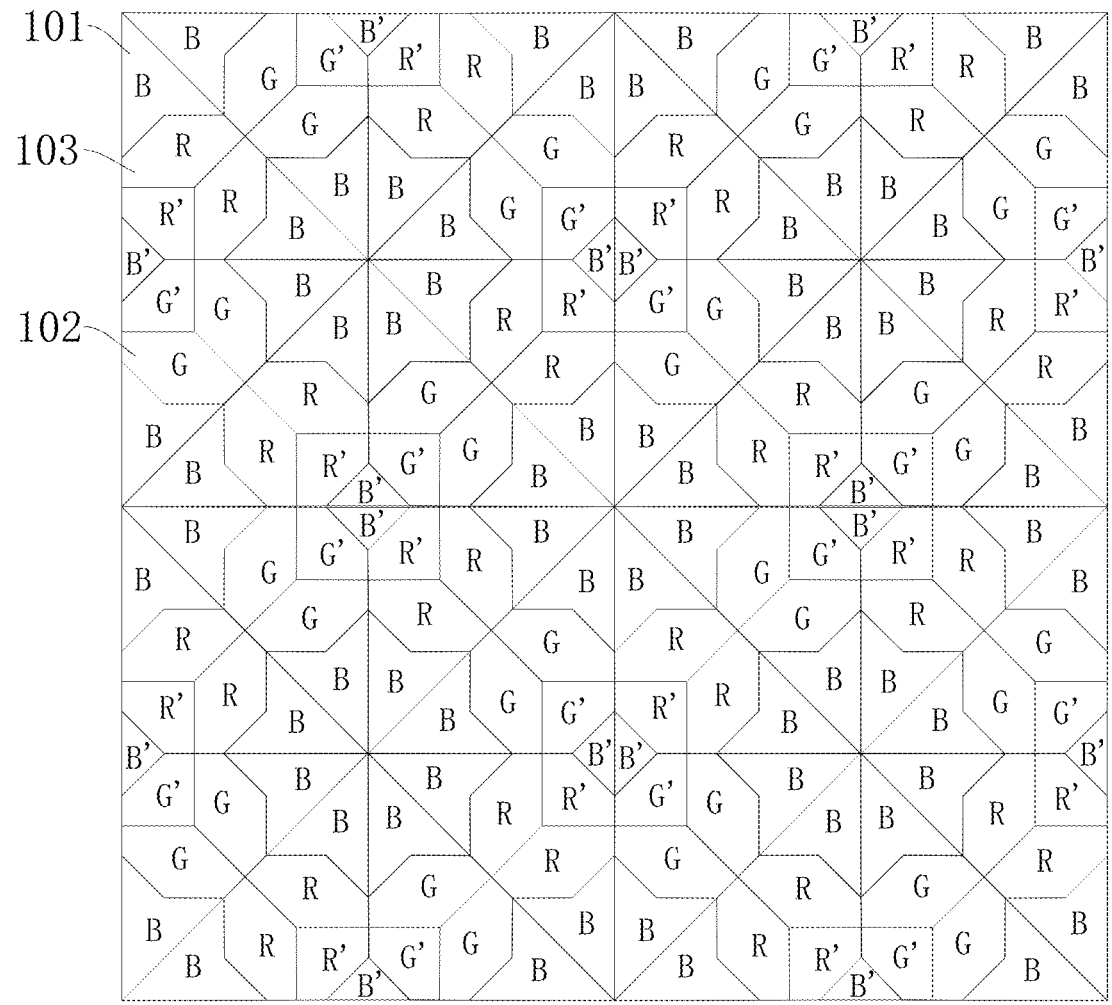
FIG. 6 shows a schematic diagram of a pixel arrangement structure according to another embodiment of the first aspect of the present application.

Referring to FIGS. 4 to 6 together, the backup pixel group 113 further includes a first backup sub-pixel 101' having the same emitting color as the first sub-pixel 101 and being located between the second backup sub-pixel 102' and the third backup sub-pixel 103'.

The backup pixel group 113 further includes the first backup sub-pixel 101' having the same emitting color as the first sub-pixel 101, which can complement the emitting color of the first sub-pixel 101, therefore the compensation effect of the backup pixel group 113 is improved, and the color gamut of the pixel arrangement structure is further enhanced.

When the repeat units 100 are arranged in an array along the first direction and the second direction, for two of the repeat units 100 that are adjacent along the first direction and/or the second direction, at least two of the first backup sub-pixels 101' in the backup pixel groups 113 are arranged adjacent to each other, so that the two adjacent ones of the first backup sub-pixels 101' can be formed by evaporation molding with a shared evaporation opening.

Optionally, the repeat unit 100 is a square, and the pixel group 110 is an isosceles right triangle and symmetrical about the symmetry line L. Therefore, the arrangement of the various sub-pixels in the repeat unit 100 is more regular and uniform, and the display effect of the pixel arrangement structure is improved.

Optionally, within the pixel group 110, the two second sub-pixels 102 and the second backup sub-pixel 102' that are adjacent are distributed as an octagon. Further, within the pixel group 110, the two second sub-pixels 102 and the second backup sub-pixel 102' that are adjacent to each other are distributed as a regular octagon. In these optional embodiments, the arrangement of the various sub-pixels in the pixel group 110 is more regular and the color rendering of the pixel arrangement structure is more uniform.

Optionally, the second backup sub-pixel 102' and the second sub-pixels 102 are of the same shape and size, and one edge of the regular octagon overlaps one of the diagonals. When the second backup sub-pixel 102' and the second sub-pixels 102 are arranged in the above manner, the two first sub-pixels 101 in the first light-emitting pixel group 111 can be symmetrically distributed, so that when the repeat units 100 are arranged in an array along the first direction and the second direction, the eight sub-pixels located at the center of the repeat unit 100 have the same distribution pattern as the eight adjacent first sub-pixels 101 formed by the four repeat units 100, and the structure of the mask plate for evaporation of the first sub-pixels 101 can be simplified.

Within the pixel group 110, the two third sub-pixels 103 and the third backup sub-pixel 103' that are adjacent are distributed as an octagon. Optionally, the two third sub-pixels 103 and the third backup sub-pixel 103' that are adjacent to each other are distributed as a regular octagon.

Optionally, the third backup sub-pixel 103' and the third sub-pixels 103 are of the same shape and size, and one edge of the regular octagon overlaps one of the diagonals. When the third backup sub-pixel 103' and the third sub-pixels 103 are arranged in the above manner, the two first sub-pixels 101 in the second light-emitting pixel group 112 can be symmetrically distributed, so that when the repeat units 100 are arranged in an array along the first direction and the second direction, the eight sub-pixels located at the center of the repeat unit 100 have the same distribution pattern as the eight adjacent first sub-pixels 101 formed by the four repeat units 100, and the structure of the mask plate for evaporation of the first sub-pixels 101 can be simplified.

Figure 7:
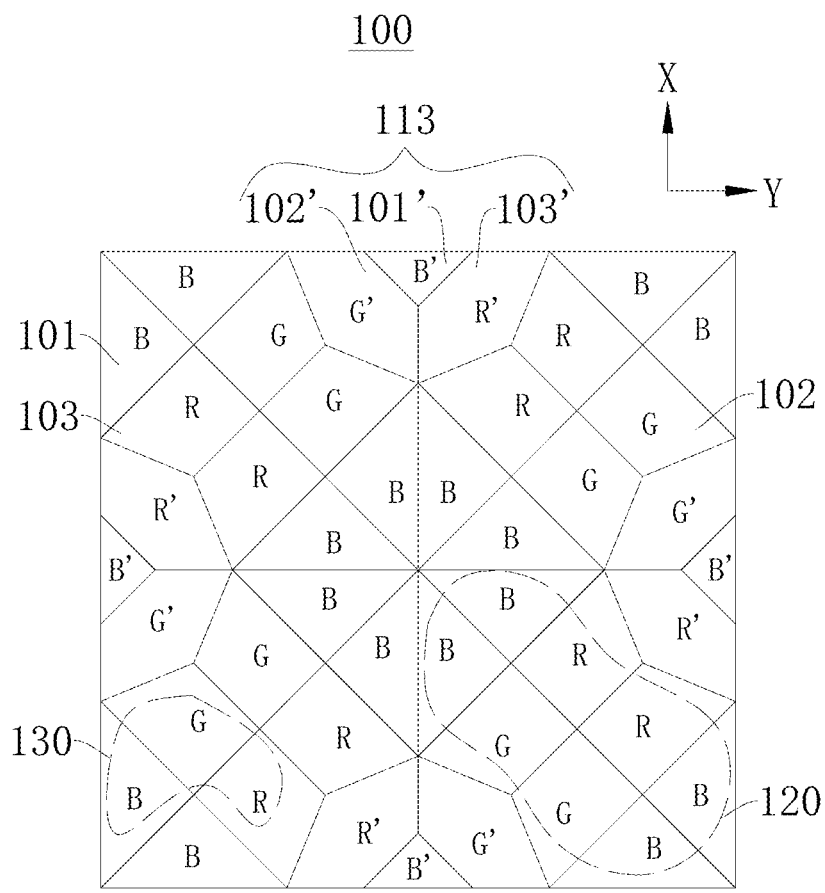
FIG. 7 shows a schematic structural diagram of a repeat unit in a pixel arrangement structure according to yet another embodiment of the first aspect of the present application.
Figure 8:
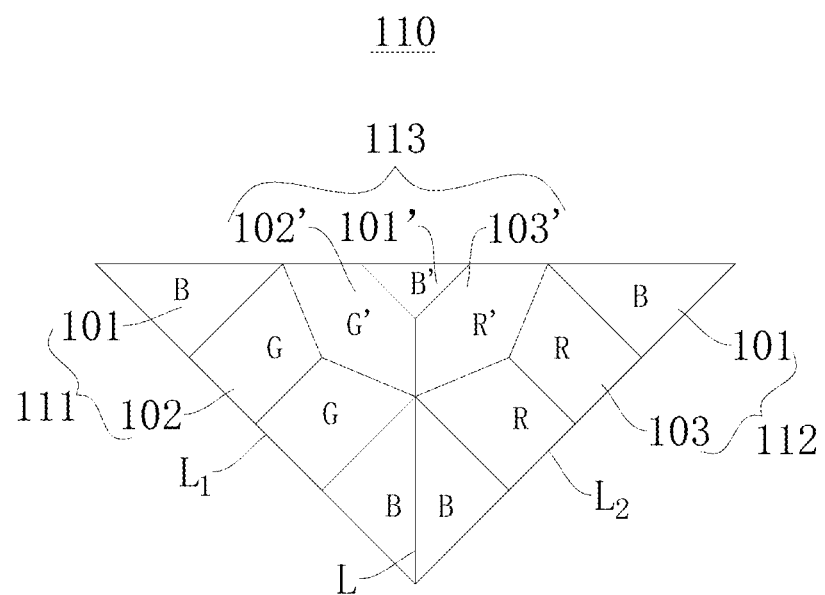
FIG. 8 shows a schematic structural diagram of a pixel group of a repeat unit in a pixel arrangement structure according to yet another embodiment of the first aspect of the present application.
Figure 9:
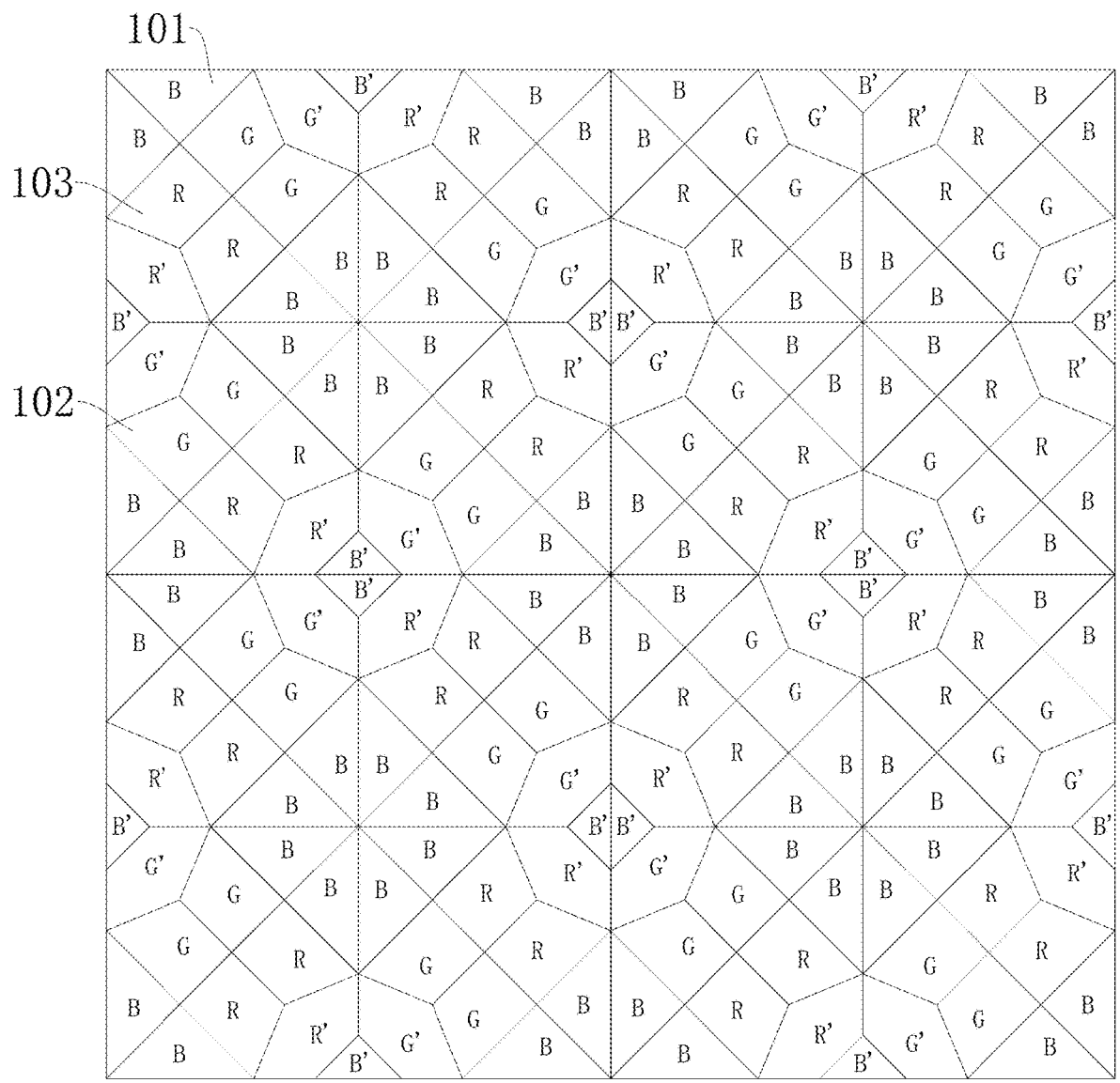
FIG. 9 shows a schematic diagram of a pixel arrangement structure according to yet another embodiment of the first aspect of the present application.

Referring to FIGS. 7 to 9 together, the eight of the first sub-pixels 101 that are arranged close to the intersection of the two diagonals are distributed as a square, and the opening on the mask plate for evaporation of the first sub-pixels 101 is a square, the forming process of the mask plate can be simplified.

The two first sub-pixels 101 located at the intersection of two edges of the repeat unit 100 are distributed as an isosceles right triangle. When the repeat units 100 are distributed in an array along the first direction and the second direction, the two first sub-pixels 101 located at the intersection of two edges of each of the four repeat units 100 are arranged adjacent to each other, and these eight of the first sub-pixels 101 may also be distributed as a square.

The eight of the first sub-pixels 101 that are arranged close to the intersection of the two diagonals have the same size as the adjacent eight sub-pixels formed by the four repeat units 100, and the structure of the mask plate for evaporation of the first sub-pixels 101 can be simplified.

The two second sub-pixels 102 and the second backup sub-pixel 102' that are adjacent are distributed as a hexagon. The two third sub-pixels 103 and the third backup sub-pixel 103' that are adjacent are distributed as a hexagon.

Figure 10:
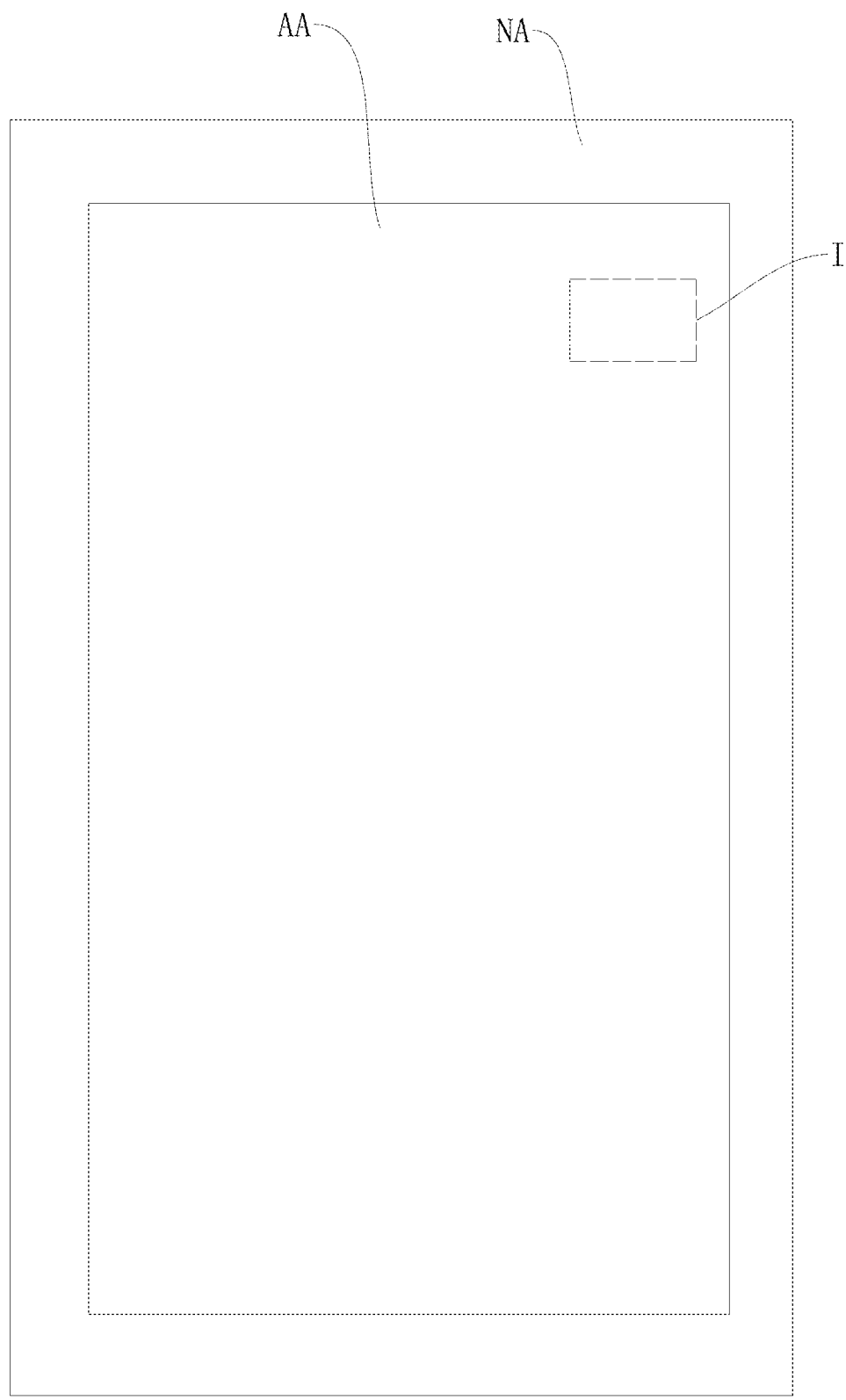
FIG. 10 shows a schematic structural diagram of a display panel according to the embodiments of the present application.
Figure 11:
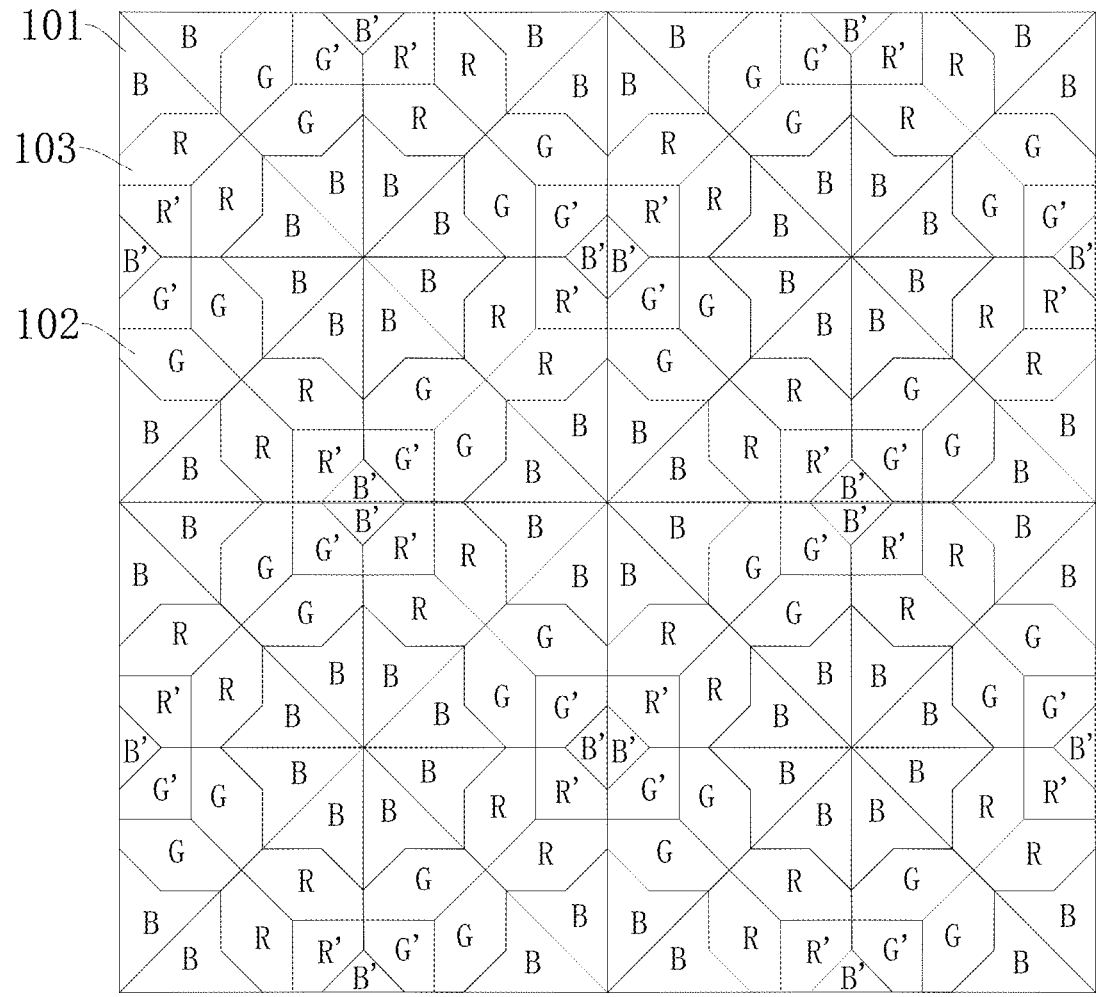
FIG. 11 shows a partially enlarged schematic structural diagram of area I in FIG. 10.

Referring to FIGS. 10 and 11 together, the display panel according to the present application includes the pixel arrangement structure of any one of the above embodiments. Since the display panel according to the embodiments of the present application includes the pixel arrangement structure of any one of the above embodiments, the display panel has the beneficial effects of the pixel arrangement structure, which will not be repeated herein.

The display panel includes a display area AA and a non-display area NA surrounding the display area AA. In other embodiments, the display panel may include only the display area AA without the non-display area NA. A partial magnification of the display area AA shows that the display panel utilizes the pixel arrangement structure as described above.

The present application further provides an electronic device including the display panel as described above. Since the electronic device includes the display panel, the electronic device has all the beneficial effects of the display panel, which will not be repeated herein.

Herein, the type of the electronic device is not limited, for example, the electronic device may be a mobile terminal, a display, etc.

The embodiments of the present application further provide a mask assembly to be applied for evaporation of the pixel arrangement structure as described above, the mask assembly includes: a first mask plate configured for evaporation of the first sub-pixels 101 and including a first evaporation opening adapted to an outer contour of a plurality of the first sub-pixels 101 that are adjacent in the pixel arrangement structure; a second mask plate configured for evaporation of the second sub-pixels 102 and the second backup sub-pixels 102' and including a second evaporation opening adapted to an outer contour of a plurality of the second sub-pixels 102 and the second backup sub-pixels 102' that are adjacent in the pixel arrangement structure; and a third mask plate configured for evaporation of the third sub-pixels 103 and the third backup sub-pixels 103' and including a third vaporization opening adapted to an outer contour of a plurality of the third sub-pixels 103 and the third backup sub-pixels 103' that are adjacent in the pixel arrangement structure.

When the backup pixel group 113 further includes the first backup sub-pixel 101', the first mask plate is further configured for evaporation of the first backup sub-pixels 101'.

What is claimed is:

1. A pixel arrangement structure comprising:
a plurality of repeat units arranged in an array, each of the repeat units being a quadrilateral and comprising four pixel groups, each of the pixel groups being located within an area defined by two diagonals of the repeat unit, wherein the pixel group comprises:
a first light-emitting pixel group, comprising at least one first sub-pixel and at least one second sub-pixel arranged along one of the diagonals;
a second light-emitting pixel group, comprising at least one first sub-pixel and at least one third sub-pixel arranged along the other of the diagonals, the at least one first sub-pixel in the first light-emitting pixel group and the at least one first sub-pixel in the second light-emitting pixel group being symmetrically distributed about a symmetry line, and the at least one second sub-pixel in the first light-emitting pixel group and the at least one third sub-pixel in the second light-emitting pixel group being symmetrically distributed about the symmetry line; and
a backup pixel group, located adjacent to an edge of the repeat unit and between the first light-emitting pixel group and the second light-emitting pixel group, the backup pixel group at least comprising a second backup sub-pixel and a third backup sub-pixel, the second backup sub-pixel having a same emitting color as the second sub-pixel and the third backup sub-pixel having a same emitting color as the third sub-pixel;
wherein a ratio between a number of the at least one first sub-pixel and a number of the at least one second sub-pixel in the first light-emitting pixel group is 1:1, and a ratio between a number of the at least one first sub-pixel and a number of the at least one third sub-pixel in the second light-emitting pixel group is 1:1.

2. The pixel arrangement structure of claim 1, wherein in the first light-emitting pixel group, the at least one first sub-pixel comprises two first sub-pixels and the at least one second sub-pixel comprises two second sub-pixels, the two first sub-pixels are distributed at intervals along one of the diagonals, and the two second sub-pixels are distributed along the one of the diagonals and located between the two first sub-pixels; and
in the second light-emitting pixel group, the at least one first sub-pixel comprises two first sub-pixels and the at least one third sub-pixel comprises two third sub-pixels, the two first sub-pixels are distributed at intervals along the other of the diagonals, and the two third sub-pixels are distributed along the other of the diagonals and located between the two first sub-pixels.

3. The pixel arrangement structure of claim 2, wherein one of the first sub-pixels in the first light-emitting pixel group is adjacent to one of the first sub-pixels in the second light-emitting pixel group.

4. The pixel arrangement structure of claim 3, wherein the second backup sub-pixel in the backup pixel group is arranged adjacent to the second sub-pixel, so that the second backup sub-pixel and the second sub-pixel are formed by evaporation molding with a shared opening;
the third backup sub-pixel is arranged adjacent to the third sub-pixel, so that the third backup sub-pixel and the third sub-pixel are formed by evaporation molding with a shared opening; and
the second backup sub-pixel and the third backup sub-pixel are symmetrically distributed with respect to the symmetry line.

5. The pixel arrangement structure of claim 4, wherein the repeat unit is a square, and the pixel group is an isosceles triangle and symmetrical about the symmetry line.

6. The pixel arrangement structure of claim 5, wherein within the pixel group, the two second sub-pixels and the second backup sub-pixel that are adjacent to each other are distributed as a regular octagon.

7. The pixel arrangement structure of claim 6, wherein the second backup sub-pixel and the second sub-pixels are of a same shape and size, and one edge of the regular octagon overlaps one of the diagonals.

8. The pixel arrangement structure of claim 5, wherein the two third sub-pixels and the third backup sub-pixel that are adjacent to each other are distributed as a regular octagon.

9. The pixel arrangement structure of claim 8, wherein the third backup sub-pixel and the third sub-pixels are of a same shape and size, and one edge of the regular octagon overlaps one of the diagonals.

10. The pixel arrangement structure of claim 2, wherein the four pixel groups are distributed around an intersection of the two diagonals, and for two adjacent pixel groups in one of the repeat units, the first light-emitting pixel group of one of the two adjacent pixel groups and the second light-emitting pixel group of the other of the two adjacent pixel groups are adjacent to each other and located at two sides of one of the diagonals.

11. The pixel arrangement structure of claim 10, wherein for the first light-emitting pixel group and the second light-emitting pixel group located at two sides of a same one of the diagonals,
four of the first sub-pixels, two of the second sub-pixels and two of the third sub-pixels form one low pixel display unit, and the first light-emitting pixel group and the second light-emitting pixel group form the low pixel display unit.

12. The pixel arrangement structure of claim 10, wherein for the first light-emitting pixel group and the second light-emitting pixel group located at two sides of a same one of the diagonals,
one of the first sub-pixels, one of the second sub-pixels and one of the third sub-pixels form one high pixel display unit, two adjacent high pixel display units share the second sub-pixel and the third sub-pixel, and the first light-emitting pixel group and the second light-emitting pixel group form four high pixel display units.

13. The pixel arrangement structure of claim 12, wherein the backup pixel group further comprises a first backup sub-pixel having a same emitting color as the first sub-pixel and being located between the second backup sub-pixel and the third backup sub-pixel.

14. The pixel arrangement structure of claim 13, wherein the repeat units are arranged in an array along a first direction and a second direction, and for two of the repeat units adjacent to each other along the first direction and/or the second direction, at least two of the first backup sub-pixels in the backup pixel group are arranged adjacent to each other, so that two adjacent ones of the first backup sub-pixels are formed by evaporation molding with a shared evaporation opening.

15. The pixel arrangement structure of claim 12, wherein the repeat unit is a square, and eight of the first sub-pixels arranged near the intersection of the two diagonals in the repeat unit are distributed as a square.

16. The pixel arrangement structure of claim 15, wherein the repeat units are arranged in an array along a first direction and a second direction, and eight adjacent first sub-pixels formed by four repeat units are distributed as a square.

17. A display panel comprising the pixel arrangement structure of claim 1.

* * * * *